United States Patent
Nagashima et al.

(10) Patent No.: US 12,424,472 B2
(45) Date of Patent: Sep. 23, 2025

(54) SUBSTRATE STORING CONTAINER

(71) Applicant: Miraial Co. Ltd., Tokyo (JP)

(72) Inventors: Tsuyoshi Nagashima, Tokyo (JP);
Ryuuji Fukuda, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 130 days.

(21) Appl. No.: 18/551,473

(22) PCT Filed: Mar. 29, 2021

(86) PCT No.: PCT/JP2021/013258
§ 371 (c)(1),
(2) Date: Sep. 20, 2023

(87) PCT Pub. No.: WO2022/208602
PCT Pub. Date: Oct. 6, 2022

(65) Prior Publication Data
US 2024/0162069 A1    May 16, 2024

(51) Int. Cl.
*H01L 21/673*  (2006.01)
*H01L 21/67*  (2006.01)
*H01L 21/677*  (2006.01)

(52) U.S. Cl.
CPC .... *H01L 21/67393* (2013.01); *H01L 21/6732* (2013.01); *H01L 21/67383* (2013.01); *H01L 21/67772* (2013.01); *H01L 21/67389* (2013.01)

(58) Field of Classification Search
CPC ........... H01L 21/67393; H01L 21/6732; H01L 21/67383; H01L 21/67772;

(Continued)

(56) References Cited

U.S. PATENT DOCUMENTS 6,521,007 B1 * 2/2003 Tanaka .............. H01L 21/67393
                                                      55/385.2
6,723,151 B2 * 4/2004 Tanaka ............... B01D 53/0454
                                                        96/111

(Continued)

FOREIGN PATENT DOCUMENTS

JP     2001085507 A     3/2001
JP     2003318254 A    11/2003

(Continued)

*Primary Examiner* — Gideon R Weinerth
(74) *Attorney, Agent, or Firm* — MUNCY, GEISSLER, OLDS & LOWE, P.C.

(57) ABSTRACT

The present invention comprises: a container body; a lid; a lid-side substrate support capable of supporting edges of substrates when a container body opening is closed by the lid; a rear-side substrate support that is disposed as a counterpart of the lid-side substrate support in a substrate housing space, is capable of supporting the edges of the substrates, and supports the substrates in a state in which the edges of the substrates are arranged parallel to each other by the rear-side substrate support together with the lid-side substrate support while the container body opening is closed; a pair of lateral substrate supports that are disposed to face each other in a lateral direction in the substrate housing space and are configured to contact the edges of the substrates to be able to support the edges of the substrates in a state in which the adjacent substrates are arranged parallel to each other at predetermined intervals; and support constituent parts that are disposed to face the inner surfaces of side walls of a wall of the container body. The lateral substrate supports are provided in the support constituent parts, and a dehumidifying agent is placeable between the support constituent parts and the inner surfaces of the side walls of the wall of the container body.

5 Claims, 10 Drawing Sheets

(58) Field of Classification Search
CPC ......... H01L 21/67769; H01L 21/67389; H01L 23/564; Y10S 414/135
USPC ................. 55/385.2; 206/710, 711, 712, 204
See application file for complete search history.

(56) References Cited

U.S. PATENT DOCUMENTS

| | | | | |
|---|---|---|---|---|
| 10,312,122 | B2* | 6/2019 | Ogawa | H01L 21/67389 |
| 10,672,637 | B2* | 6/2020 | Glavan | H01L 21/67376 |
| 10,734,264 | B2 | 8/2020 | King et al. | |
| 10,923,373 | B2* | 2/2021 | Ogawa | H01L 21/67379 |
| 11,011,399 | B2* | 5/2021 | Matsutori | H01L 21/67393 |
| 11,581,209 | B2* | 2/2023 | Steffens | H01L 21/67379 |
| 11,901,205 | B2* | 2/2024 | Smith | H01L 21/67253 |
| 2005/0247594 | A1* | 11/2005 | Mimura | H01L 21/67393 206/710 |
| 2007/0170090 | A1* | 7/2007 | Po | H01L 21/67017 220/745 |
| 2017/0287758 | A1* | 10/2017 | Kanamori | H01L 21/67366 |
| 2018/0138065 | A1* | 5/2018 | King | H01L 23/564 |
| 2019/0206708 | A1* | 7/2019 | Woo | H01L 21/67393 |
| 2020/0020549 | A1* | 1/2020 | Ogawa | F16K 15/026 |
| 2020/0075374 | A1* | 3/2020 | Smith | H01L 21/67376 |
| 2020/0206717 | A1* | 7/2020 | Dubois | B01J 20/2803 |
| 2021/0143040 | A1* | 5/2021 | Steffens | H01L 21/67386 |
| 2021/0323756 | A1* | 10/2021 | Chiu | B65D 81/18 |
| 2023/0030188 | A1* | 2/2023 | Miller | B01J 20/20 |
| 2023/0411191 | A1* | 12/2023 | Fuller | H01L 21/67393 |
| 2023/0411192 | A1* | 12/2023 | Fuller | H01L 21/67369 |
| 2024/0145284 | A1* | 5/2024 | Matsutori | H01L 21/673 |
| 2024/0162069 | A1* | 5/2024 | Nagashima | B65D 85/30 |
| 2025/0149363 | A1* | 5/2025 | Fuller | H01L 21/67393 |

FOREIGN PATENT DOCUMENTS

| | | |
|---|---|---|
| JP | 2004531064 A | 10/2004 |
| JP | 2007119072 A | 5/2007 |
| JP | 2018120912 A | 8/2018 |
| JP | 2019029596 A | 2/2019 |
| WO | 02093622 A2 | 11/2002 |

* cited by examiner

FIG. 2
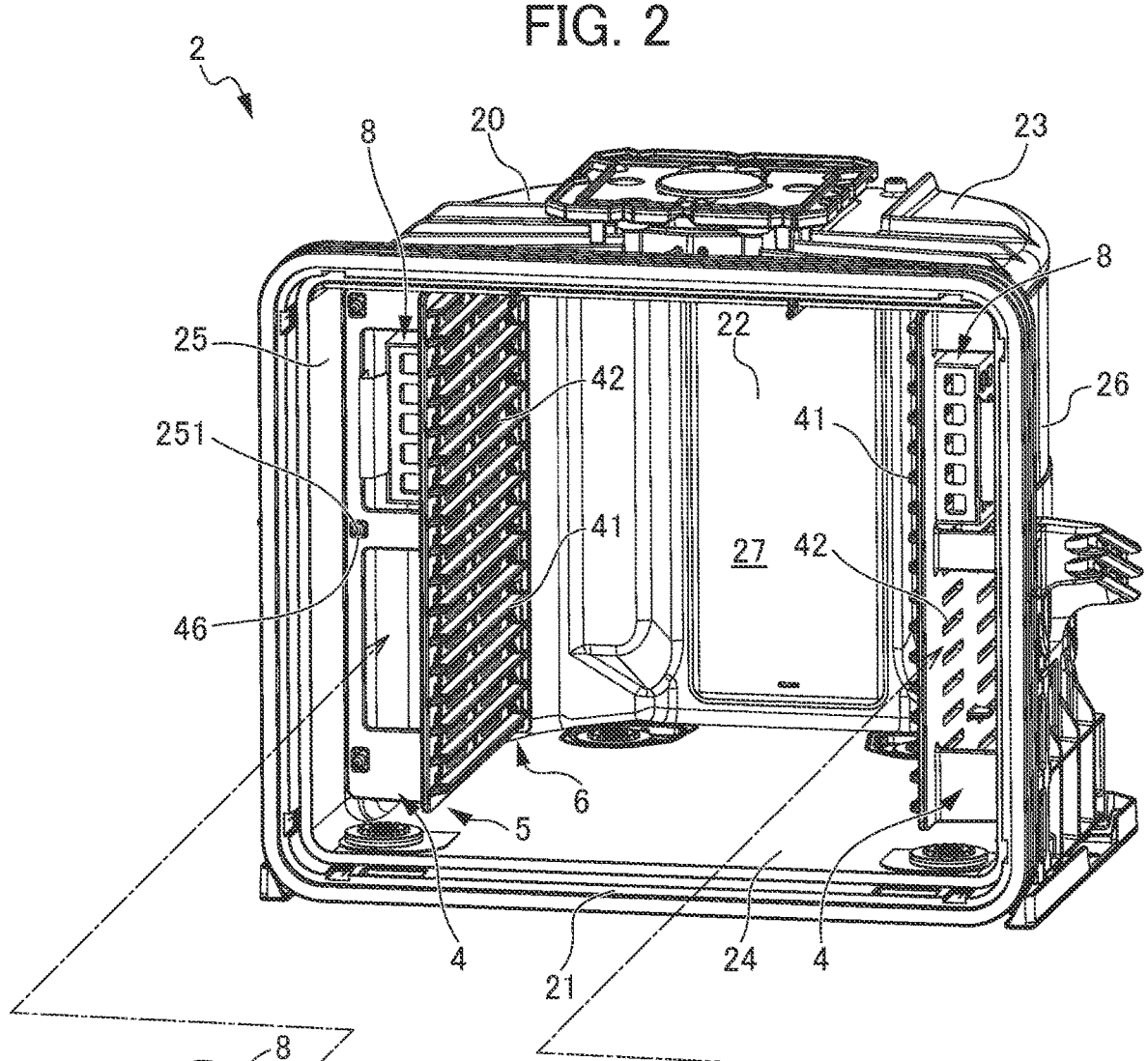
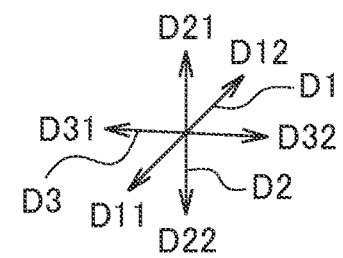

FIG. 3
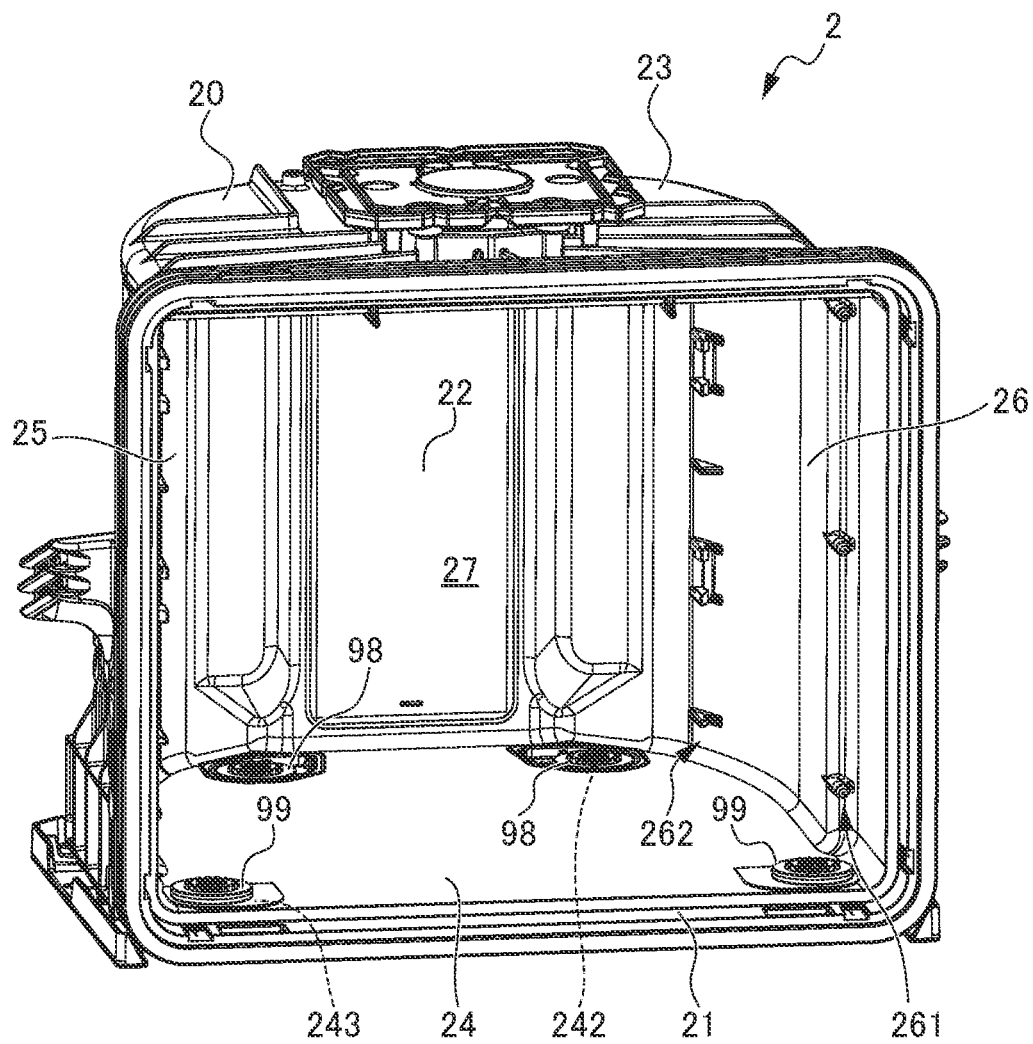
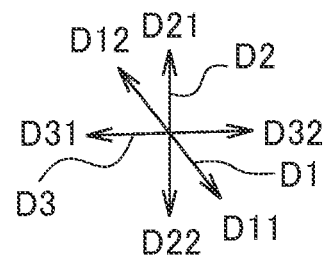

FIG. 5
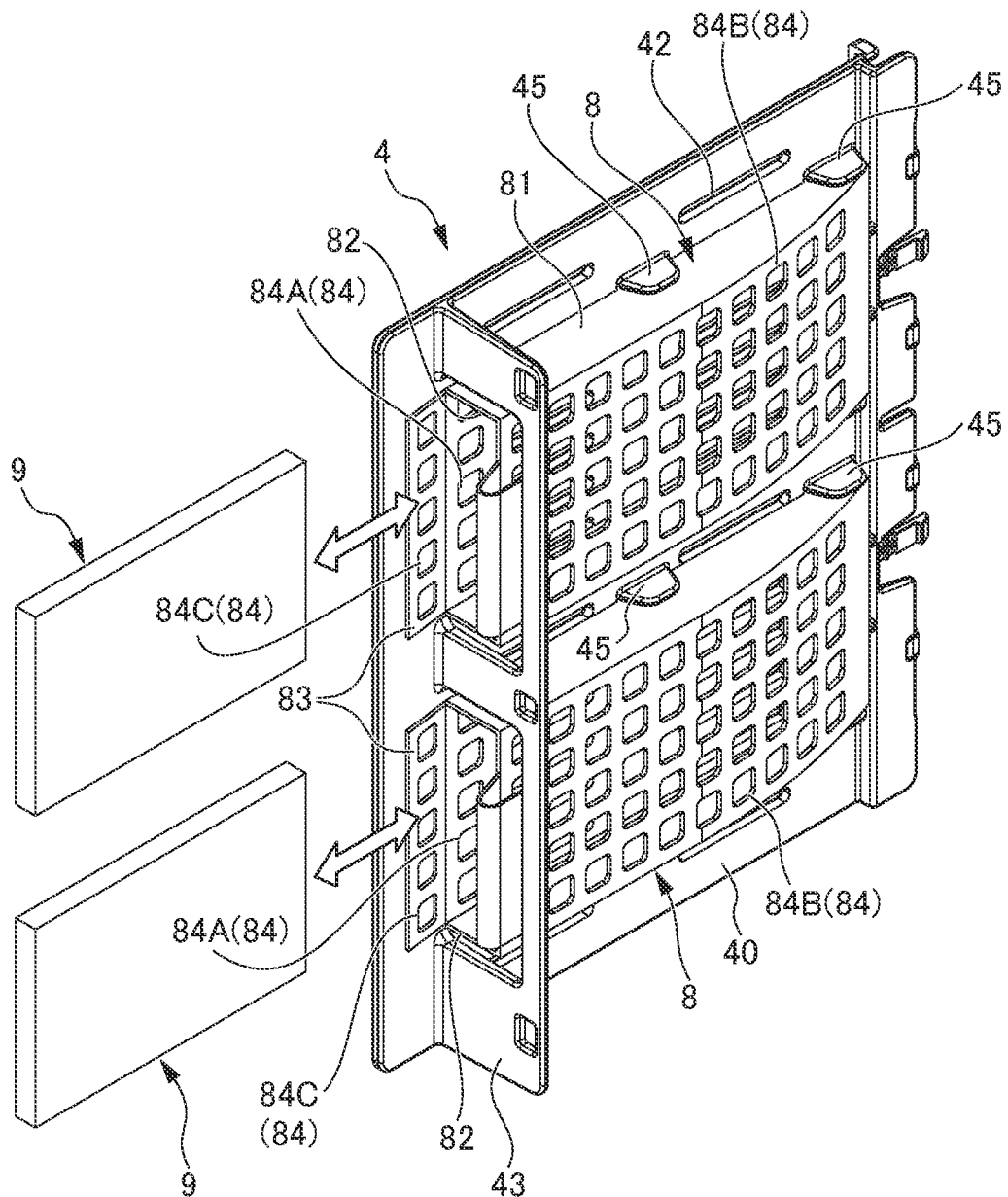
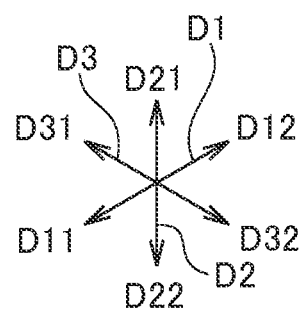

FIG. 8
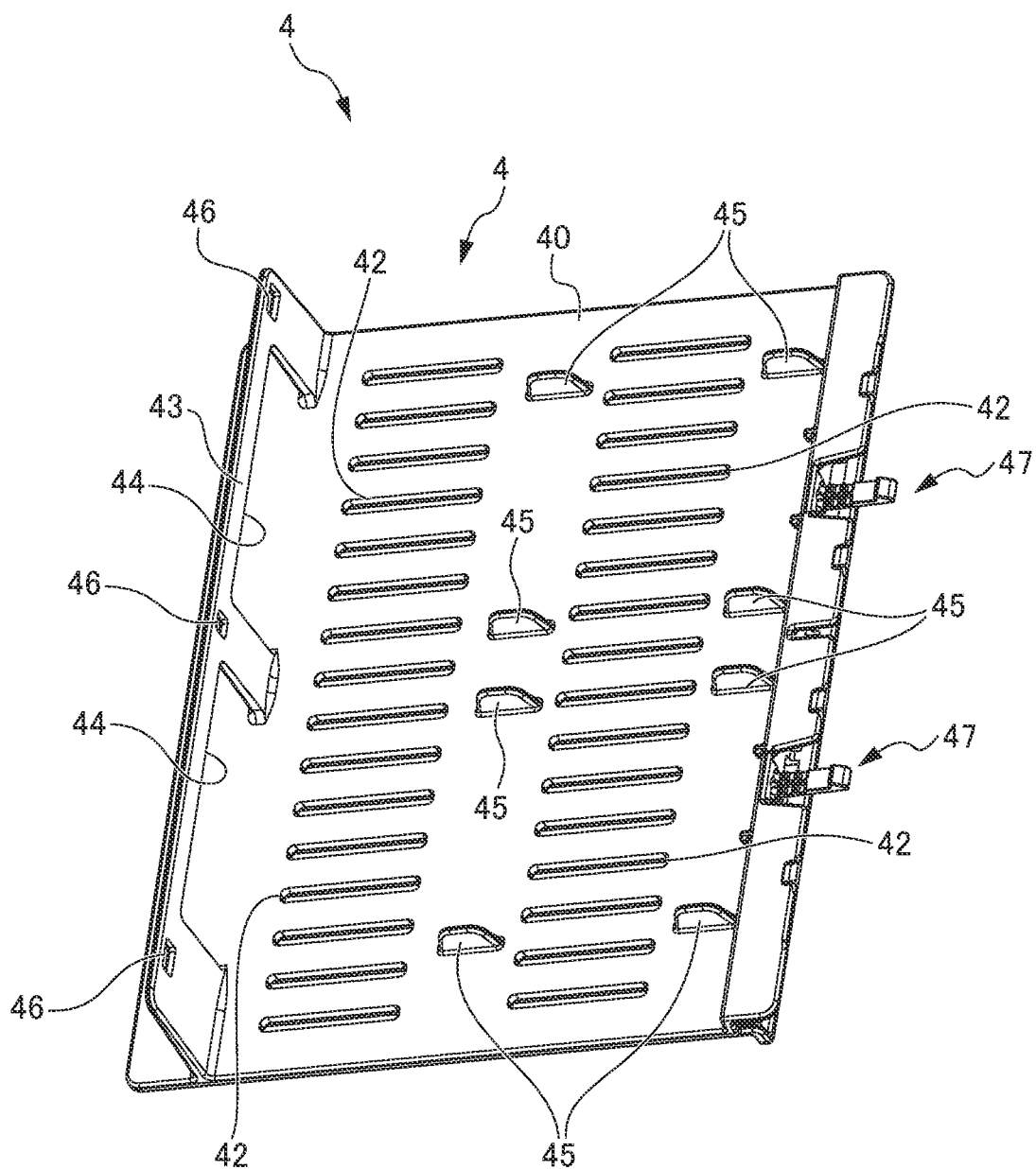
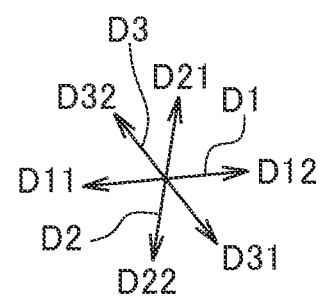

FIG. 10
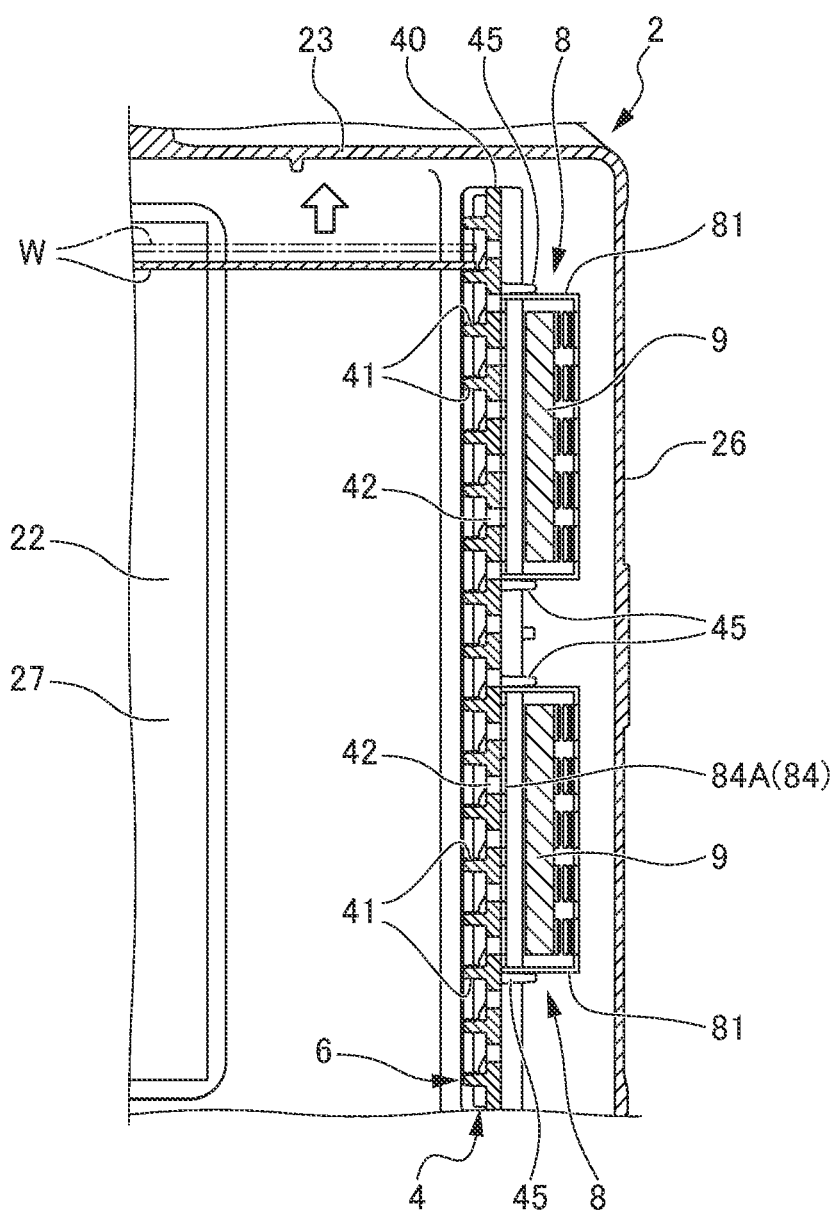
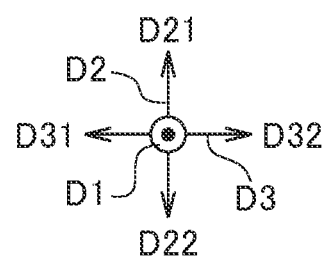

SUBSTRATE STORING CONTAINER

TECHNICAL FIELD

The present invention relates to a substrate storing container (substrate storing container) for use to accommodate, store, and transport substrates such as semiconductor wafers, reticles, and printed circuit boards.

BACKGROUND ART

A known substrate storing container for storing various types of substrates includes a container body and a lid.

The container body has a container body opening at one end thereof. The container body has a wall with a closed tubular shape at the other end thereof. The container body includes therein a substrate storing space. The substrate storing space is surrounded and defined by the wall, and is capable of storing substrates therein. The lid is detachably attachable to the container body opening, and can close the container body opening. Lateral-side substrate supports are provided on the wall such that the lateral-side substrate supports form counterparts to each other in the substrate storing space. When the container body opening is not closed by the lid, the lateral-side substrate supports can support edge portions of the substrates such that the adjacent substrates are arranged in parallel at predetermined intervals.

The lid is provided with a front retainer (lid-side substrate supports) on a portion thereof that faces the substrate storing space in a state where the container body opening is closed by the lid. The front retainer can support edge portions of the substrates in the state where the container body opening is closed by the lid. Back-side substrate supports are provided on the wall such that the back-side substrate supports form counterparts to the front retainer. The back-side substrate supports can support edge portions of the substrates. In the state where the container body opening is closed by the lid, the back-side substrate supports support the substrates in cooperation with the front retainer, and thereby support the substrates such that the adjacent substrates are arranged in parallel at predetermined intervals.

The substrates, which are stored in the substrate storing space of the substrate storing container, are very vulnerable to moisture (moisture in air) in many cases. The substrate storing space can be dehumidified by purging air from the substrate storing space; however, it is difficult to perform the purge during transport or the like. To address this, a known substrate storing container has a dehumidification function for dehumidifying the substrate storing space (for example, see Patent Document 1).

The substrate storing container disclosed in Patent Document 1 is provided with a case (dehumidifying agent housing case) that houses a dehumidifying agent and is externally attached to the container body. The container body has a communication hole, and the substrate storing space in the container body communicates with the inside of the dehumidifying agent housing case through the communication hole. As a result, the dehumidifying agent in the dehumidifying agent housing case performs its dehumidification function in the substrate storing space.

CITATION LIST

Patent Document

Patent Document 1: U.S. patent Ser. No. 10/734,264

DISCLOSURE OF THE INVENTION

Problems to be Solved by the Invention

However, in the case where the dehumidifying agent housing case is externally attached to the container body, it is difficult to achieve perfect airtightness between the container body and the dehumidifying agent housing case. Furthermore, the dehumidification function is sufficiently performed only in the vicinity of the communication hole, resulting in a low dehumidification effect.

A configuration is conceivable in which a dehumidifying agent is arranged in the substrate storing space of the container body. However, when this configuration is employed, the substrate storing space may not be utilized with spatial efficiency unless the dehumidifying agent is arranged in a thoughtfully devised way.

It is an object of the present invention to provide a substrate storing container which has a dehumidification function of dehumidifying the inside of a substrate storing space and in which the substrate storing space can be utilized with spatial efficiency.

Means for Solving the Problems

The present invention relates to a substrate storing container including: a container body having a container body opening at one end, and a wall with a closed tubular shape at the other end, the container body including a substrate storing space that is defined by an inner surface of the wall, is capable of storing a plurality of substrates, and communicates with the container body opening; a lid detachably attachable to the container body opening, and capable of closing the container body opening; lid-side substrate supports arranged on a portion of the lid that faces the substrate storing space in a state where the container body opening is closed by the lid, the lid-side substrate supports being capable of supporting edge portions of the plurality of substrates in the state where the container body opening is closed by the lid; back-side substrate supports arranged to form counterparts to the lid-side substrate supports in the substrate storing space, the back-side substrate supports being capable of supporting edge portions of the plurality of substrates and configured to support, in cooperation with the lid-side substrate supports, the plurality of substrates such that the edge portions of the plurality of substrates are arranged in parallel in the state where the container body opening is closed by the lid; lateral-side substrate supports arranged to form counterparts to each other in a lateral direction in the substrate storing space, the lateral-side substrate supports being capable of supporting edge portions of the plurality of substrates when in contact with the edge portions of the plurality of substrates such that the substrates adjacent to each other are arranged in parallel at predetermined intervals; and a support-forming member (support-bearing member) configured to be disposed to face an inner surface of a side wall belonging to the wall of the container body. The lateral-side substrate supports are provided on the support-forming member, and a dehumidifying agent is able to be disposed between the support-forming member and the inner surface of the side wall belonging to the wall of the container body.

Preferably, the substrate storing container further includes an agent holding member between the support-forming member and the inner surface of the side wall belonging to the wall of the container body, the agent holding member being configured to hold the dehumidifying agent.

It is preferable that in a state where the support-forming member is disposed to face the inner surface of the side wall belonging to the wall of the container body, the agent holding member is insertable between the support-forming member and the inner surface of the side wall belonging to the wall of the container body from a side adjacent to the container body opening, and is removable toward the side adjacent to the container body opening.

It is preferable that in a state where the agent holding member is disposed between the support-forming member and the inner surface of the side wall belonging to the wall of the container body, the agent holding member allows the dehumidifying agent to be placed into the agent holding member from a side adjacent to the container body opening and allows the dehumidifying agent to be removed from the agent holding member toward the side adjacent to the container body opening.

It is preferable that the support-forming member has a communication hole that establishes communication between the substrates supported on the lateral-side substrate supports or the back-side substrate supports and the agent holding member.

Effects of the Invention

The present invention provides a substrate storing container which has a dehumidification function of dehumidifying the inside of a substrate storing space and in which the substrate storing space can be utilized with spatial efficiency.

BRIEF DESCRIPTION OF THE DRAWINGS

FIG. 2 is an exploded perspective view illustrating the substrate storing container 1 in a state in which substrates W are not stored;

FIG. 3 is a perspective view illustrating the substrate storing container 1 having support-forming members 4 and agent holding members 8 removed therefrom;

FIG. 5 is an exploded perspective view illustrating a state in which dehumidifying agents 9 are disposed outside the agent holding members 8;

FIG. 8 is a perspective view of a right-side support-forming member 4 as viewed from the right;

FIG. 10 is a longitudinal cross-sectional view taken along a plane passing through the right-side support-forming member 4, the agent holding members 8, and the dehumidifying agents 9.

PREFERRED MODE FOR CARRYING OUT THE INVENTION

[Overall Configuration of Substrate Storing Container 1]

Figure 1:
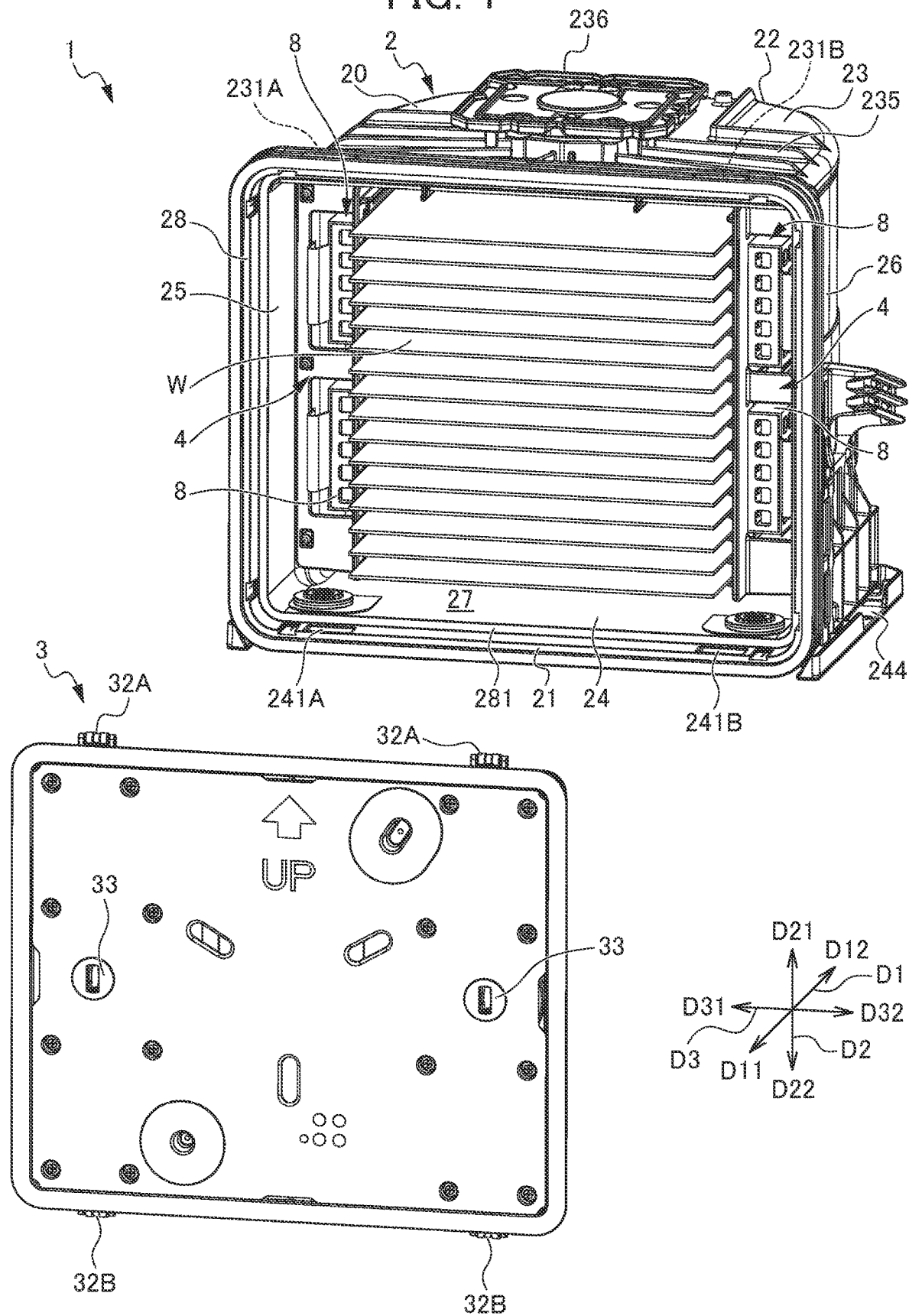
FIG. 1 is an exploded perspective view illustrating a substrate storing container 1 according to an embodiment of the present invention that has a plurality of substrates W stored therein.

A substrate storing container 1 according to an embodiment will be described below with reference to the drawings. FIG. 1 is an exploded perspective view illustrating the substrate storing container 1 according to the embodiment of the present invention that has a plurality of substrates W stored therein. FIG. 2 is an exploded perspective view illustrating the substrate storing container 1 in a state where substrates W are not stored. FIG. 3 is a perspective view illustrating the substrate storing container 1 having support-forming members 4 and agent holding members 8 removed therefrom.

Here, for the sake of convenience of description, the direction from a container body 2 (to be described later) toward a lid 3 (to be described later) (i.e., the direction from the upper right toward the lower left in FIG. 1) is defined as the forward direction D11, the direction opposite to the forward direction D11 is defined as the backward direction D12, and the forward and backward directions are collectively defined as the forward/backward direction D1. The direction from a bottom wall 24 (to be described later) toward a top wall 23 (to be described later) (i.e., the upward direction in FIG. 1) is defined as the upward direction D21, the direction opposite to the upward direction D21 is defined as the downward direction D22, and the upward and downward directions are collectively defined as the upward/downward direction D2. The direction from a second side wall 26 (to be described later) toward a first side wall 25 (to be described later) (i.e., the direction from the lower right toward the upper left in FIG. 1) is defined as the left direction D31, the direction opposite to the left direction D31 is defined as the right direction D32, and the left and right directions are collectively defined as the left/right direction D3 or the lateral direction D3. The principal figures show arrows indicating the foregoing directions.

Each of the substrates W (see FIG. 1) that is stored in the substrate storing container 1 is a thin substrate for industrial use, and examples of which include a semiconductor wafer such as a disk-shaped (circular plate-shaped) silicon wafer, a glass wafer, and a sapphire wafer, a reticle, a rectangular (quadrangular) plate-shaped printed circuit board, and the like. The substrates W of the present embodiment are rectangular plate-shaped printed circuit boards.

As illustrated in FIGS. 1 to 3, the substrate storing container 1 is for use as an in-process container for storing and carrying the substrates W in a process in a factory, or as a shipping container for transporting the substrates by transportation means such as land transport, air transport, and sea transport. The substrate storing container 1 includes the container body 2, the lid 3, support-forming members 4, lateral-side substrate supports 5, back-side substrate supports 6, a front retainer (not shown) as lid-side substrate supports, and agent holding members 8. The lateral-side substrate supports 5 and the back-side substrate supports 6 are provided on each support-forming member 4.

The container body 2 has a container body opening 21 at one end, and a wall 20 with a closed tubular shape at the other end. The container body 2 includes therein a substrate storing space 27. The substrate storing space 27 is surrounded and defined by the wall 20. The support-forming members 4 are disposed adjacent to portions of the wall 20 that define the substrate storing space 27. As illustrated in FIG. 1, a plurality of substrates W can be stored in the substrate storing space 27.

The lateral-side substrate supports 5 are provided on the support-forming members 4 such that the lateral-side substrate supports 5 form counterparts to each other in the substrate storing space 27. When in contact with edge portions of the plurality of substrates W, the lateral-side substrate supports 5 can support the edge portions of the plurality of substrates W such that adjacent substrates W are arranged in parallel at predetermined intervals. The back-side substrate supports 6 are located backward of the lateral-side substrate supports 5 and are formed integrally with the support-forming members 4.

The back-side substrate supports 6 are provided on the support-forming members 4 such that the back-side substrate supports 6 form counterparts to the front retainer (not shown) in the substrate storing space 27. When in contact with edge portions of the plurality of substrates W, the back-side substrate supports 6 can support backward edge portions of the plurality of substrates W.

The lid 3 is detachably attachable to an opening peripheral edge 28 that defines the container body opening 21, and can close the container body opening 21. The front retainer (not shown) is provided on a portion of the lid 3, which faces the substrate storing space 27 in a state where the container body opening 21 is closed by the lid 3. The front retainer is disposed so as to form a counterpart to the back-side substrate supports 6 in the substrate storing space 27.

When in contact with edge portions of the plurality of substrates W in the state where the container body opening 21 is closed by the lid 3, the front retainer can support front edge portions of the plurality of substrates W. In the state where the container body opening 21 is closed by the lid 3, the front retainer supports the plurality of substrates W in cooperation with the back-side substrate supports 6 such that the adjacent substrates W are arranged in parallel at predetermined intervals.

The substrate storing container 1 is made of a resin such as a plastic material. Unless otherwise specified, examples of the resin as the material include thermoplastic resins such as polycarbonates, cycloolefin polymers, polyetherimide, polyether ketone, polybutylene terephthalate, polyether ether ketone, and liquid crystal polymers, and alloys thereof. A conductive substance, such as carbon fibers, carbon powder, carbon nanotubes, and a conductive polymer, is selectively added to the foregoing resins as the molding materials in a case where conductivity is to be imparted. It is also possible to add glass fibers, carbon fibers, or the like in order to increase the rigidity.

[Container Body 2]

In the following, each component will be described in detail. As illustrated in FIGS. 1 to 3, the wall 20 of the container body 2 includes a back wall 22, the top wall 23, the bottom wall 24, the first side wall 25, and the second side wall 26. The back wall 22, the top wall 23, the bottom wall 24, the first side wall 25, and the second side wall 26 are made of one or more of the above-described materials, and are integrated into one piece.

The first side wall 25 and the second side wall 26 face each other, and the top wall 23 and the bottom wall 24 face each other. The back end of the top wall 23, the back end of the bottom wall 24, the back end of the first side wall 25, and the back end of the second side wall 26 are all connected to the back wall 22. The front end of the top wall 23, the front end of the bottom wall 24, the front end of the first side wall 25, and the front end of the second side wall 26 constitute the opening peripheral edge 28 that define the container body opening 21 having a substantially rectangular shape.

The opening peripheral edge 28 is provided at the one end of the container body 2, and the back wall 22 is located at the other end of the container body 2. The outer surface of the wall 20 forms the outer shape of the container body 2, which is a box shape. The inner surface of the wall 20, that is, the inner surface of the back wall 22, the inner surface of the top wall 23, the inner surface of the bottom wall 24, the inner surface of the first side wall 25, and the inner surface of the second side wall 26 surround and define the substrate storing space 27. The container body opening 21 defined by the opening peripheral edge 28 communicates with the substrate storing space 27 surrounded by the wall 20 and formed in the container body 2. A maximum of 16 substrates W can be stored in the substrate storing space 27.

Latch engagement recesses 231A, 231B, 241A, and 241B, which are concave outward with respect to the substrate storing space 27, are formed in portions of the top wall 23 and the bottom wall 24 near the opening peripheral edge 28. A total of four latch engagement recesses 231A, 231B, 241A, and 241B are formed in proximity to the left and right ends of the top wall 23 and the left and right ends the bottom wall 24, on a one-to-one basis.

On the outer surface of the top wall 23, a rib 235 is formed integrally with the top wall 23. The rib 235 increases the rigidity of the container body 2. A top flange 236 is fixed to a central portion of the top wall 23. The top flange 236 is a member by means of which the substrate storing container 1 is hooked and hung in an automated wafer transport system (e.g., an AMHS), a wafer substrate transport cart (e.g., a PGV), or the like.

A bottom plate 244 is fixed to the bottom wall 24. The bottom plate 244 fixed to the bottom wall 24 has a substantially rectangular plate shape and is arranged to face substantially the entire lower surface constituting the outer surface of the bottom wall 24.

The bottom wall 24 has, near its four corners, intake openings 242 and discharge openings 243, which are two types of through holes. In the present embodiment, the two through holes formed at two locations in a front portion of the bottom wall 24 serve as the discharge openings 243 for discharging gas from the inside of the container body 2, and the two through holes formed at two locations in a back portion serve as the intake openings 242 for supplying gas to the inside of the container body 2.

The through holes as the intake openings 242 are each provided with an intake filter unit 98 as an additional component, and the through holes as the discharge openings 243 are each provided with a discharge filter unit 99. That is, a gas flow path in each intake filter unit 98 and a gas flow path in each discharge filter unit 99 form part of a ventilation path that allows for communication between the substrate storing space 27 and the space outside the container body 2. The intake filter units 98 and the discharge filter units 99 are disposed on the wall 20, and each allow gas to flow between the space outside the container body 2 and the substrate storing space 27 via a respective filter (not shown). A purge gas supplied to the intake filter units 98 is supplied to the substrate storing space 27. The discharge filter units 99 are configured to allow gas to pass therethrough, from the substrate storing space 27 to the space outside the container body 2.

[Support-Forming Members 4]

Figure 4:
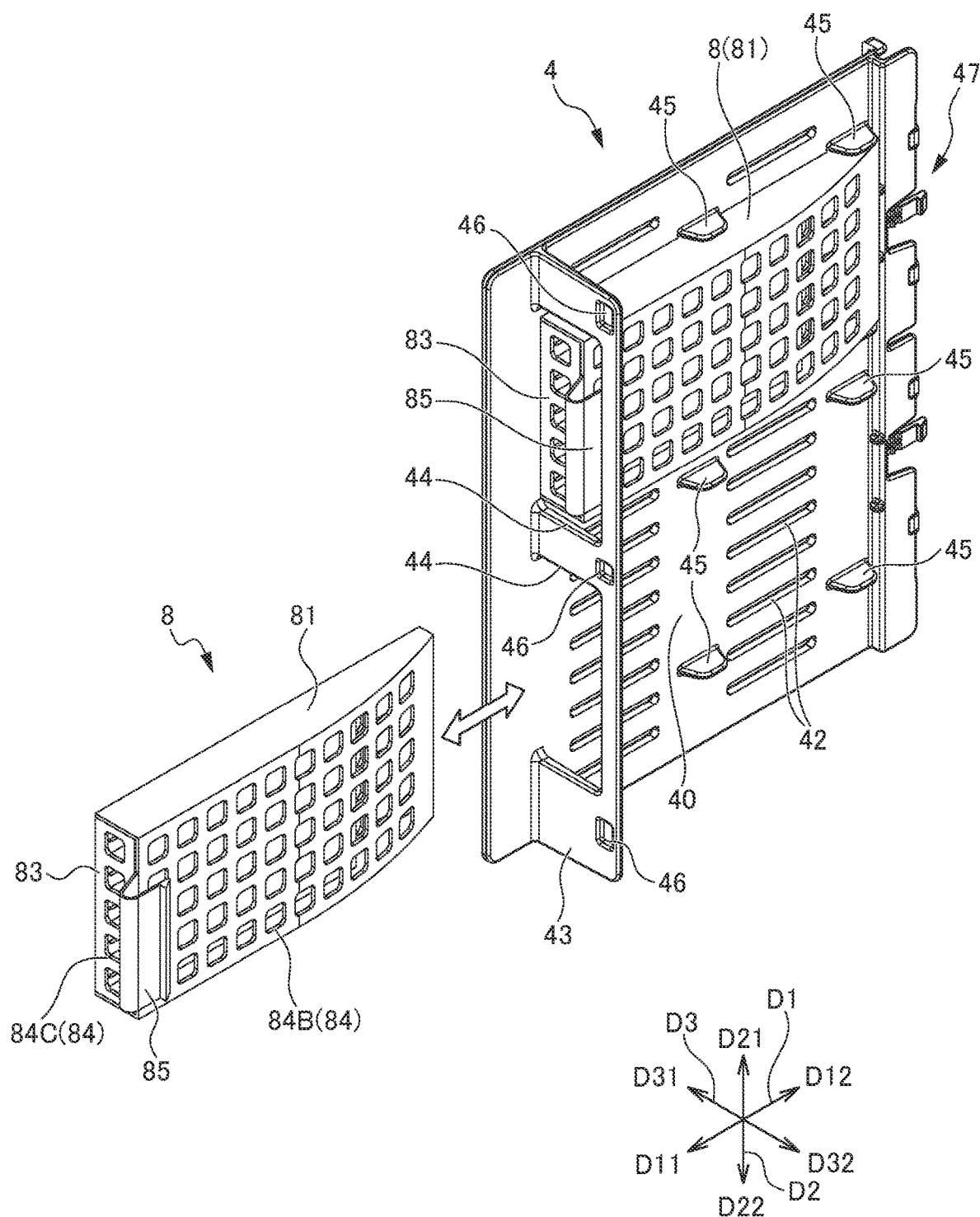
FIG. 4 is an exploded perspective view illustrating a right-side support-forming member 4 and the agent holding members 8.
Figure 6:
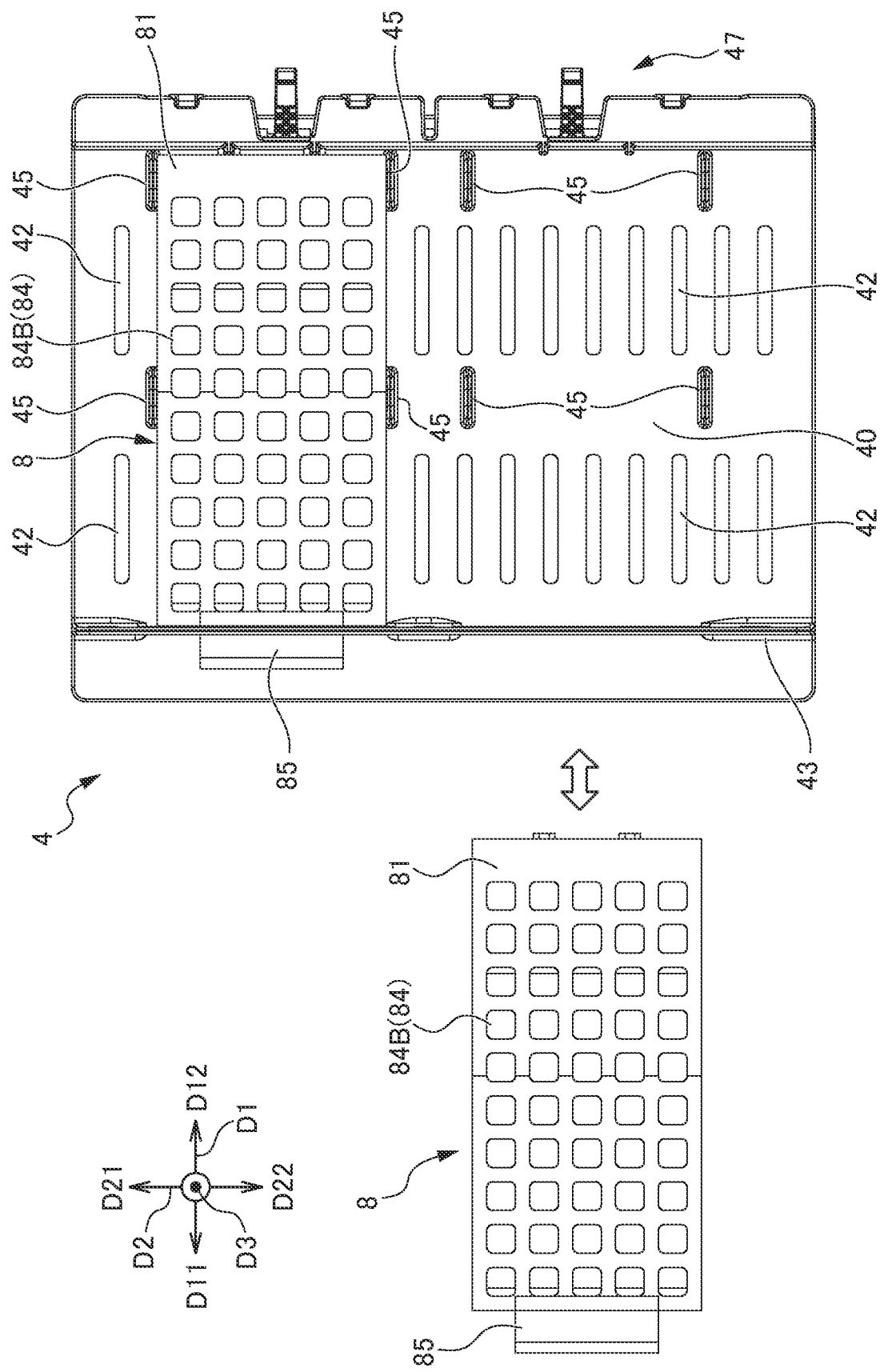
FIG. 6 is a right side view corresponding to FIG. 4.
Figure 7:
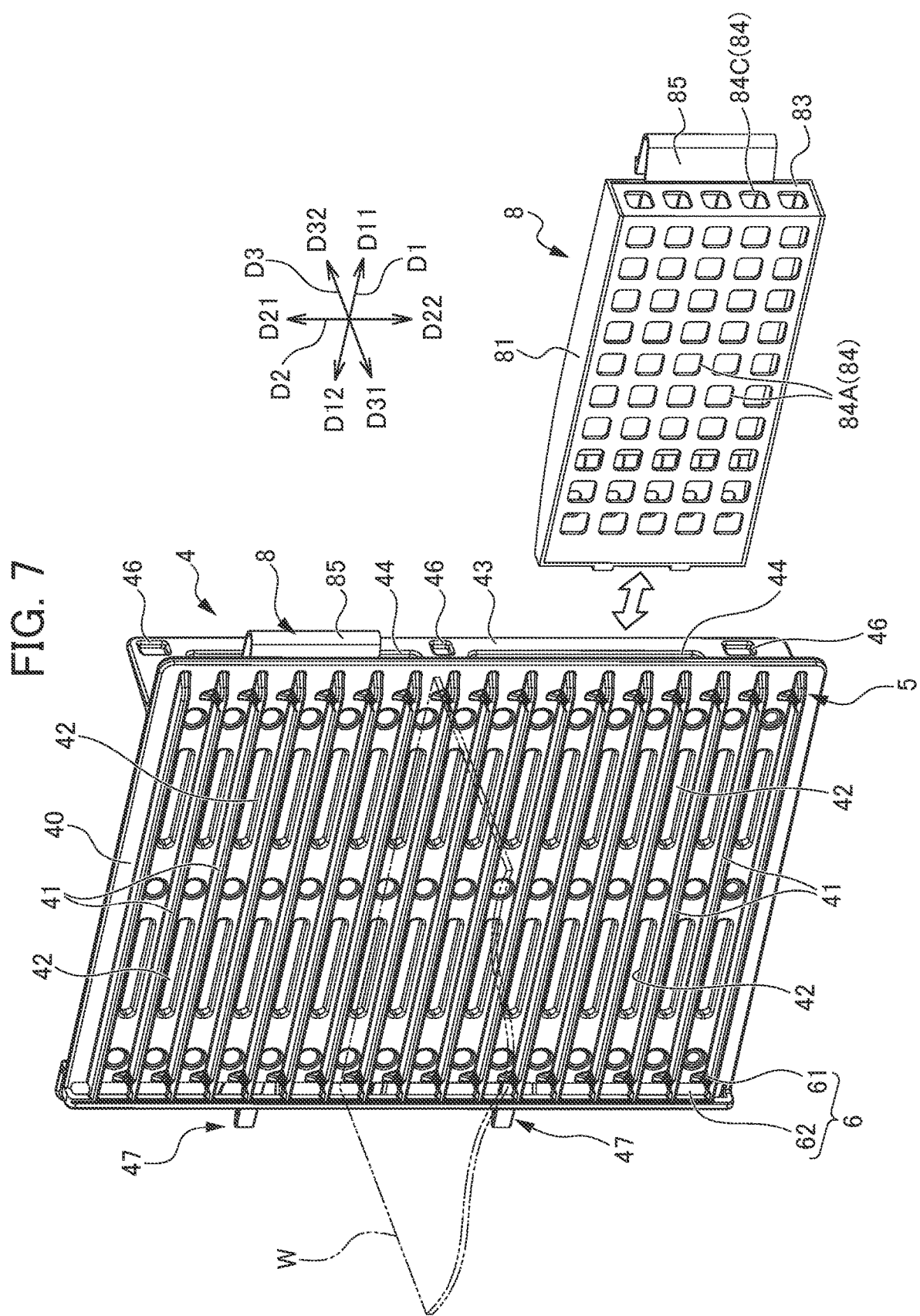
FIG. 7 is an exploded perspective view corresponding to FIG. 4, as viewed from the left.
Figure 9:
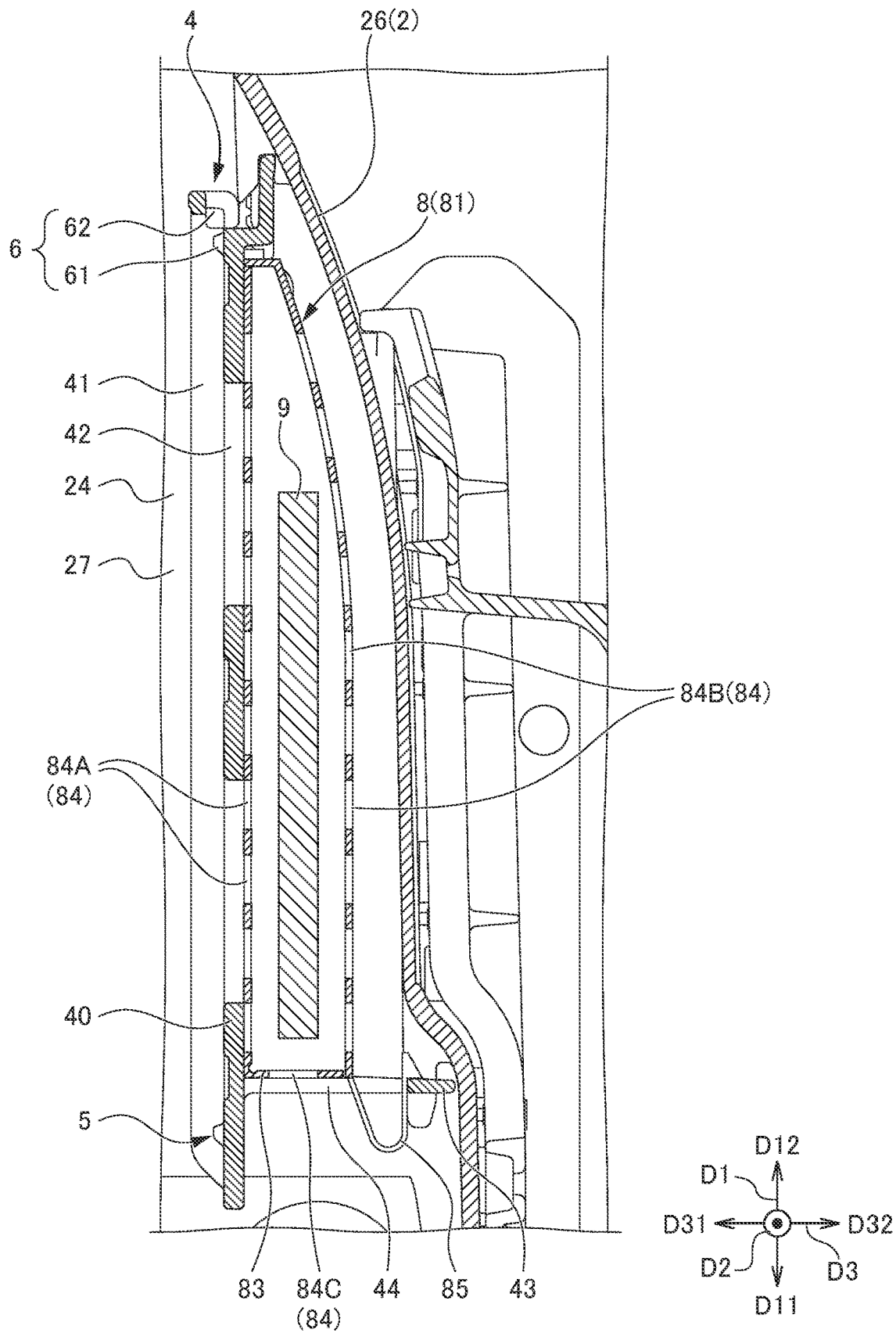
FIG. 9 is a transverse cross-sectional view taken along a plane passing through the right-side support-forming member 4, the agent holding member 8, and the dehumidifying agent 9.

Next, the details of the support-forming member 4 will be described with reference to the drawings. FIG. 4 is an exploded perspective view illustrating the right-side support-forming member 4 and the agent holding members 8. FIG. 5 is an exploded perspective view illustrating a state in which dehumidifying agents 9 are disposed outside the agent holding members 8. FIG. 6 is a right side view corresponding to FIG. 4. FIG. 7 is an exploded perspective view corresponding to FIG. 4, as viewed from the left. FIG. 8 is a perspective view of the right-side support-forming member 4 as viewed from the right. FIG. 9 is a transverse cross-sectional view taken along a plane passing through the right-side support-forming member 4, the agent holding member 8, and the dehumidifying agent 9. FIG. 10 is a longitudinal cross-sectional view taken along a plane passing through the right-side support-forming member 4, the agent holding members 8, and the dehumidifying agents 9.

As illustrated in FIGS. 4 to 10, the support-forming member 4 includes a vertical plate-shaped body 40, transverse plate parts 41, the lateral-side substrate supports 5, the back-side substrate supports 6, communication holes 42, a front wall 43, holding holes 44, guide pieces 45, front engagement parts 46, and back engagement parts 47. As illustrated in FIG. 2, the support-forming members 4 respectively face the inner surfaces of the first side wall 25 and the second side wall 26 belonging to the wall 20 of the container body 2, and are disposed to form counterparts to each other in the left/right direction D3. In FIG. 4 and the subsequent drawings, the right-side support-forming member 4 (disposed adjacent to the second side wall 26) is illustrated as a representative example, and the description of the right-side support-forming member 4 applies to the left-side support-forming member 4 (disposed adjacent to the first side wall 25) (because basically, they have mutually inverse structures in the left/right direction).

The vertical plate-shaped body 40 is a flat plate-shaped member extending in a D1-D2 plane. Between the vertical plate-shaped body 40 and the inner surface of the second side wall 26, the agent holding members 8 for housing and holding the dehumidifying agent 9 are disposed.

The transverse plate parts 41 are plate-shaped parts protruding inwardly in the lateral direction D3, from the surface of the vertical plate-shaped body 40 facing the inside in the lateral direction D3. Each transverse plate part 41 extends in a D1-D3 plane. For example, 17 transverse plate parts 41 are arranged in the upward/downward direction D2. The adjacent transverse plate parts 41 are in a positional relationship in which they are arranged in parallel and spaced apart from each other in the upward/downward direction D2. As illustrated in FIG. 2, the plurality of transverse plate parts 41 provided on the right-side support-forming member 4 and the plurality of transverse plate parts 41 provided on the left-side support-forming member 4 are in a position relation in which they face each other in the left/right direction D3.

[Lateral-Side Substrate Supports 5]

As illustrated in FIGS. 2 and 7, the lateral-side substrate supports 5 are disposed such that the lateral-side substrate supports 5 form counterparts to each other in the lateral direction D3 in the substrate storing space 27. When in contact with edge portions of the plurality of substrates W, the lateral-side substrate supports 5 can support the edge portions of the plurality of substrates W such that the adjacent substrates W are arranged in parallel at predetermined intervals. The lateral-side substrate supports 5 are located in a front-side portion of the vertical plate-shaped body 40, and each lateral-side substrate support 5 is situated on the surface of the vertical plate-shaped body 40 facing the inside in the lateral direction D3 and on the upper surface of the transverse plate part 41. Each lateral-side substrate support 5 is adapted to be in substantial point contact with the substrate W, and not in surface contact with substrate W. The lateral-side substrate support 5 is not provided on the uppermost transverse plate part 41. In other words, the uppermost transverse plate part 41 does not directly contribute to supporting the substrate W.

[Back-Side Substrate Supports 6]

As illustrated in FIGS. 2 and 7, the number of the back-side substrate supports 6 is set such that the back-side substrate supports 6 correspond, on a one-to-one basis, to the substrates W that can be stored in the substrate storing space 27; specifically, 16 back-side substrate supports 6 are provided. The back-side substrate supports 6 disposed on the right-side and left-side support-forming members 4 are in a positional relationship in which they form counterparts to the front retainer (to be described later) in the forward/backward direction D1. In a state where the substrates W are stored in the substrate storing space 27 and the lid 3 is closed, the back-side substrate supports 6 support edge portions of the substrates W.

The back-side substrate supports 6 are provided on a backmost portion of the vertical plate-shaped body 40. Each back-side substrate support 6 includes a back-side protrusion 61 and a back-side abutment portion 62. The back-side protrusion 61 has a configuration similar to that of the lateral-side substrate support 5, and performs a similar function. The back-side abutment portion 62 is provided integrally with a back end portion of the transverse plate part 41, and extends in a D2-D3 plane. The back-side protrusion 61 is situated in proximity to, and in front of, the back-side abutment portion 62. The back-side substrate support 6 is not provided on the uppermost transverse plate part 41. In other words, the uppermost transverse plate part 41 does not directly contribute to supporting the substrate W.

[Communication Holes 42]

As illustrated in FIGS. 4 to 10, the communication holes 42 establish communication between the substrates W supported on the lateral-side substrate supports 5 or the back-side substrate supports 6 and the agent holding members 8. The communication holes 42 are formed in the vertical plate-shaped body 40 at positions between the transverse plate parts 41, 41 that are adjacent to each other in the upward/downward direction D2. The communication holes 42 are long holes extending in the forward/backward direction D1, and two communication holes 42 are spaced apart from each other in the forward/backward direction D1.

The front wall 43 extends outward in the lateral direction D3 from a portion located forward of the transverse plate parts 41 (a portion located forward of the communication holes 42). The front wall 43 extends in a D2-D3 plane.

Two holding holes 44 are formed in the front wall 43 and are spaced apart from each other in the upward/downward direction D2. The holding holes 44 are through holes penetrating in the forward/backward direction D1. One holding hole 44 holds a front portion of one agent holding member 8. Each holding hole 44 also functions as an insertion hole via which the agent holding member 8 is moved backward with respect to the front wall 43 when the agent holding member 8 is to be set at a predetermined position on the support-forming member 4.

The guide pieces 45 are disposed backward of the front wall 43 and extend outward in the lateral direction D3 from the surface of the vertical plate-shaped body 40 that faces outside in the lateral direction D3 of Each guide piece 45 extends in a D1-D3 plane. The guide pieces 45 guide, hold, and support at least a lower part (preferably, lower and upper parts) of a portion (backside portion, intermediate portion) of the agent holding member 8 held in the holding hole 44.

The front engagement parts 46 are provided on the front wall 43, and are formed as holes in the present embodiment. The front engagement parts 46 engage with front engagement parts 251 (see FIG. 2) and front engagement parts 261 (see FIG. 3) provided on front portions of the side walls (the first side wall 25, the second side wall 26) of the container body 2. In the present embodiment, the front engagement parts 46 simply engage with the front engagement parts 251 and 261. However, this is a non-limiting example, and the front engagement parts may be configured to be fastened to each other.

The back engagement parts 47 are provided on the vertical plate-shaped body 40. The back engagement parts 47 engage with, and are fastened to, back engagement parts (not shown) provided on a back portion of the first side wall 25 and back engagement parts 262 (see FIG. 3) provided on a back portion of the second side wall 26 of the container body 2. In the present embodiment, the back engagement parts 47 and the back engagement parts on the side walls are fastened to each other, but this is a non-limiting example. The back engagement parts 47 and the back engagement parts may simply engage with each other.

As illustrated in FIG. 2, by means of the front engagement parts 46 and the back engagement parts 47, the support-forming members 4 are fastened to the container body 2 in a state in which the support-forming members 4 respectively face the inner surfaces of the first side wall 25 and the second side wall 26 of the container body 2 and form counterparts to each other in the left/right direction D3.

In the present embodiment, each of the vertical plate-shaped bodies 40 of the support-forming members 4 has a flat plate shape extending along the edge (that is straight in the forward/backward direction) of the substrate W. Therefore, it would be adequate that the side walls (the first side wall 25, the second side wall 26) of the container body 2 have flat inner surfaces extending along the shape of the vertical plate-shaped body 40 of the support-forming member 4. However, in the present embodiment, the side walls (the first side wall 25, the second side wall 26) of the container body 2 bulge outward in the lateral direction D3. That is, the container body 2 and the lid 3 are originally for use to store disk-shaped substrates such as semiconductor wafers. Generally, substrate storing containers for disk-shaped substrates are in greater demand than substrate storing containers for rectangular plate-shaped substrates. Therefore, the substrate storing containers for disk-shaped substrates can be manufactured at a lower cost than the substrate storing containers for rectangular plate-shaped substrates. For this reason, the container body and the lid of a substrate storing container for disk-shaped substrates are used as the container body 2 and the lid 3 of the present embodiment. The substrate-forming members 4 having a structure for supporting the rectangular plate-shaped substrates W are adopted to the container body, thereby producing the substrate storing container 1 capable of storing the rectangular plate-shaped substrates W. Employing this configuration achieves not only a decrease in the manufacturing cost of the container body 2 and the lid 3, but also the following effects. Specifically, a gap is necessarily provided between the inner surface of each side wall (the first side wall 25, the second side wall 26) of the container body 2, which bulges outward in the lateral direction D3 for conforming to disk-shaped substrates, and (the outer surface in the lateral direction D3 of) the vertical plate-shaped body 40 of the support-forming member 4, which has a flat plate shape for conforming to rectangular disk-shaped substrates. In the substrate storing container 1 of the present embodiment, this gap is effectively utilized as a space in which the agent holding members 8 and the dehumidifying agent 9 are arranged.

[Agent Holding Member 8]

As illustrated in FIG. 2, the agent holding members 8 are disposed between each support-forming member 4 and the inner surface of the side wall (the first side wall 25, the second side wall 26) belonging to the wall 20 of the container body 2. As illustrated in FIGS. 4 to 10, each agent holding member 8 holds the dehumidifying agent 9. Each agent holding member 8 holds the dehumidifying agent 9 by housing the dehumidifying agent 9. The dehumidifying agent 9 is housed in the agent holding member 8, but does not have to be fastened to the agent holding member 8. Each agent holding member 8 includes an agent housing body 81, an agent insertion opening 82, an agent lid 83, communication holes 84, and a spring piece 85.

As illustrated in FIG. 2, the agent holding members 8 are disposed to face the inner surfaces of the first side wall 25 and the second side wall 26 belonging to the wall 20 of the container body 2, respectively, and form counterparts to each other in the left/right direction D3. In FIG. 4 and the subsequent drawings, the right-side agent holding member 8 (disposed adjacent to the second side wall 26) is illustrated as a representative example, but the description of the right-side agent holding member 8 applies to the left-side agent holding member 8 (disposed adjacent to the first side wall 25) (because basically, they have mutually inverse structures in the left/right direction).

As illustrated in FIGS. 4 to 10, the agent housing body 81 has a space for housing the dehumidifying agent 9. The agent insertion opening 82 is an opening provided in a front portion of the agent housing body 81. In a case where the communication holes 84 are not taken into consideration, the agent housing body 81 has a shape whose front side (the agent insertion opening 82) is open. In a case where the communication holes 84 are not taken into consideration, the agent lid 83 can close the agent insertion opening 82. The agent lid 83 is pivotally connected to the agent housing body 81 via a hinge structure, inside in the lateral direction D3. In a state where the agent insertion opening 82 is not closed by the agent lid 83, the agent housing body 81 allows for insertion and removal of the dehumidifying agent 9 from and toward the front side (the agent insertion opening 82).

The communication holes 84 allow for communication between the inside and the outside of the agent holding member 8. In the present embodiment, the communication holes 84 include inner communication holes 84A formed in a portion of the agent housing body 81 located inward in the lateral direction D3, outer communication holes 84B formed in a portion of the agent housing body 81 located outward in the lateral direction D3, and lid-side communication hole 84C formed in the agent lid 83.

In a state where the agent holding member 8 is supported on the support-forming member 4, the inner communication holes 84A and the communication holes 42 of the support-forming member 4 preferably overlap with each other in the lateral direction D3. This makes it possible to increase the cross-sectional area of a communication path between the housing space in the agent holding member 8 and a region located inward relative to the support-forming member 4 in the lateral direction D3.

The spring piece 85 is connected to a front side of the agent housing body 81 and exhibits spring properties in the lateral direction D3. In a state where the agent holding member 8 is disposed at a predetermined position with respect to the support-forming member 4, the spring piece 85 in contraction presses the agent insertion opening 82 outward in the lateral direction D3, whereby the movement of the agent holding member 8 with respect to the support-forming member 4 is restricted.

As illustrated in FIG. 2, in a state where each support-forming member 4 is disposed to face the inner surface of the side wall (the first side wall 25, the second side wall 26) belonging to the wall 20 of the container body 2, each agent holding member 8 is insertable between the support-forming member 4 and the inner surface of the side wall (the first side wall 25, the second side wall 26) belonging to the wall 20 of the container body 2 from the side adjacent to the container body opening 21, and is removable toward the side adjacent to the container body opening 21. Furthermore, as illustrated in FIG. 4, in a state where the support-forming member 4 is not disposed to face the inner surface of the side wall (the first side wall 25, the second side wall 26) belonging to the wall 20 of the container body 2, each agent holding member 8 is insertable into a gap that is to be provided between the support-forming member 4 and the inner surface of the side wall (the first side wall 25, the second side wall 26) belonging to the wall 20 of the container body 2 from the side that is to be adjacent to the container body opening 21, and is removable from the gap toward the side that is to be adjacent to the container body opening 21.

In a state where each agent holding member 8 is disposed between the support-forming members 4 and the inner surface of the side wall (the first side wall 25, the second side wall 26) belonging to the wall 20 of the container body 2, the agent holding member 8 allows the dehumidifying agent 9 to be placed into the agent holding member 8 from the side adjacent to the container body opening 21 and allows the dehumidifying agent 9 to be removed from the agent holding member 8 toward the side adjacent to the container body opening 21. Furthermore, as illustrated in FIG. 5, in a state where the agent holding member 8 is not disposed between the support-forming member 4 and the inner surface of the side wall (the first side wall 25, the second side wall 26) belonging to the wall 20 of the container body 2, the agent holding member 8 allows the dehumidifying agent 9 to be placed into the agent holding member 8 from the side that is supposed to be adjacent to the container body opening 21 and allows the dehumidifying agent 9 to be removed from the agent holding member 8 toward the side that is supposed to be adjacent to the container body opening 21.

[Dehumidifying Agent 9]

The dehumidifying agent 9 has a dehumidification function (moisture-absorbing function, drying function). The dehumidifying agent may have any shape and configuration as long as it can be held by the agent holding member 8. The dehumidifying agent 9 may be immovably or movably held by the agent holding member 8. For example, the dehumidifying agent 9 may have a size slightly smaller than the housing space of the agent holding member 8.

[Lid 3]

As illustrated in FIG. 1, the lid 3 has a substantially rectangular shape that substantially coincides with the opening peripheral edge 28 of the container body 2. The lid 3 is detachably attachable to the opening peripheral edge 28 of the container body 2. When attached to the opening peripheral edge 28, the lid 3 can close the container body opening 21 while being in a positional relationship in which the lid 3 is surrounded by the opening peripheral edge 28.

In a state where the container body opening 21 is closed by the lid 3, the inner surface of the lid 3 (the backside surface of the lid 3 in FIG. 1) faces a surface (sealing surface 281) of a step portion located at a position immediately backward of the opening peripheral edge 28 in the backward direction D12. The inner surface of the lid 3 is provided with an annular sealing member (not shown) attached along the entire outer peripheral edge of the lid 3. The sealing member annularly extends along the entire peripheral edge of the lid 3. Examples of the sealing member include various thermoplastic elastomers such as polyester-based elastically deformable elastomers and polyolefin-based elastically deformable elastomers, fluorine rubber, and silicon rubber.

In a state where the lid 3 is attached to the opening peripheral edge 28, the sealing member is elastically deformed by being sandwiched between the sealing surface 281 of the container body 2 and the inner surface of the lid 3. That is, interposing the sealing member between the lid 3 and the container body 2 makes it possible for the lid 3 to close the container body opening 21 in a state where the lid 3 and the opening peripheral edge 28 are separated from each other without contacting with each other. By detaching the lid 3 from the opening peripheral edge 28, the substrates W can be placed into and removed from the substrate storing space 27 in the container body 2.

The lid 3 is provided with a latch mechanism. As illustrated in FIG. 1, the latch mechanism is provided in proximity to the left and right ends of the lid 3, and include two upper latch parts 32A, 32A that can protrude from the upper side of the lid 3 in the upward direction D21, and two lower latch parts 32B, 32B that can protrude from the lower side of the lid 3 in the downward direction D22. The two upper latch parts 32A, 32A are disposed in proximity to the left and right ends of the upper side of the lid 3, and the two lower latch parts 32B, 32B are disposed in proximity to the left and right ends of the lower side of the lid 3.

The outer surface of the lid 3 is provide with operation parts 33. Operating the operation parts 33 from the front side of the lid 3 causes the upper latch parts 32A, 32A and the lower latch parts 32B, 32B to protrude from the upper side and the lower side of the lid 3 and to retract not to protrude from the upper side and the lower side of the lid 3. The upper latch parts 32A, 32A protrude from the upper side of the lid 3 in the upward direction D21 to engage with latch engagement recesses 231A, 231B of the container body 2, and the lower latch parts 32B, 32B protrude from the lower side of the lid 3 in the downward direction D22 to engage with latch engagement recesses 241A, 241B of the container body 2, whereby the lid 3 is fastened to the container body opening 21 of the container body 2.

On the inner side of the lid 3 (the side of the lid 3 in the backward direction D12 in FIG. 1), a recess (not shown) is formed which is concave outward with respect to the substrate storing space 27 (concave in the forward direction D11). The front retainer (not shown) is fixed to the recess.

The front retainer (not shown) has front retainer substrate receiving parts (not shown). The front retainer substrate receiving parts (not shown) are arranged in pairs while being spaced apart from each other by a predetermined distance in the left/right direction. 16 pairs of the front retainer substrate receiving parts are arranged in parallel in the upward/downward direction. When the substrates W are stored in the substrate storing space 27 and the lid 3 is closed, the front retainer substrate receiving parts support edge portions of the substrates W.

Effects of Embodiment

The substrate storing container 1 according to the present embodiment having the configuration described above exerts the following effects. The substrate storing container 1 according to the present embodiment includes: the container body 2 having the container body opening 21 at one end, and the wall 20 with a closed tubular shape at the other end, the container body 2 including the substrate storing space 27 that is defined by the inner surface of the wall 20, is capable of storing a plurality of substrates W, and communicates with the container body opening 21; the lid 3 detachably attachable to the container body opening 21 and capable of closing the container body opening 21; the lid-side substrate supports arranged on a portion of the lid 3 that faces the substrate storing space 27 in a state where the container body opening 21 is closed by the lid 3, the lid-side substrate supports being capable of supporting edge portions of the plurality of substrates W in the state where the container body opening 21 is closed by the lid 3; the back-side substrate supports 6 arranged to form counterparts to the lid-side substrate supports in the substrate storing space 27, the back-side substrate supports 6 being capable of supporting edge portion of the plurality of substrates W and configured to support, in cooperation with the lid-side substrate supports, the plurality of substrates W such that the edge portions of the plurality of substrates W are in parallel in the state where the container body opening 21 is closed by the lid 3; the lateral-side substrate supports 5 arranged to form counterparts to each other in the lateral direction D3 in the substrate storing space 27, the lateral-side substrate supports 5 being capable of supporting edge portions of the plurality of substrates W when in contact with the edge portions of the plurality of substrates W such that the adjacent substrates W are arranged in parallel at predetermined intervals; and the support-forming members 4 configured to be disposed to face the inner surfaces of the side walls (the first side wall 25, the second side wall 26) belonging to the wall 20 of the container body 2. The lateral-side substrate supports 5 are provided on the support-forming members 4, and the dehumidifying agent 9 can be disposed between each support-forming member 4 and the inner surface of the side wall (the first side wall 25, the second side wall 26) belonging to the wall 20 of the container body 2.

With this configuration, in the substrate storing container 1 of the present embodiment, the dehumidifying agent 9 is arranged in the gaps between the support-forming members 4 disposed to face the inner surfaces of the side walls (the first side wall 25, the second side wall 26) belonging to the wall 20 of the container body 2 and the inner surfaces of the side walls (the first side wall 25, the second side wall 26) of the wall 20 of the container body 2, whereby the substrate storing space 27 can be utilized with spatial efficiency.

The substrate storing container 1 according to the present embodiment further includes the agent holding members 8 that hold the dehumidifying agent 9, between the support-forming members 4 and the inner surfaces of the side walls (the first side wall 25, the second side wall 26) belonging to the wall 20 of the container body 2. This configuration of the substrate storing container 1 according to the present embodiment makes it easy to hold the dehumidifying agent 9 between the support-forming members 4 and the inner surfaces of the side walls (the first side wall 25, the second side wall 26) belonging to the wall 20 of the container body 2.

According to the present embodiment, in a state where the support-forming members 4 are disposed to face the inner surfaces of the side walls (the first side wall 25, the second side wall 26) belonging to the wall 20 of the container body 2, each agent holding member 8 is insertable between the support-forming member 4 and the inner surface of the side wall (the first side wall 25, the second side wall 26) belonging to the wall 20 of the container body 2 from the side adjacent to the container body opening 21, and is removable toward the side adjacent to the container body opening 21. Due to this configuration, the substrate storing container 1 of the present embodiment makes it easy to insert and remove each agent holding member 8 into and from a predetermined position after the support-forming members 4 have been disposed at predetermined positions in the substrate storing space 27 of the container body 2.

According to the present embodiment, in a state where each agent holding member 8 is disposed between the support-forming members 4 and the inner surfaces of the side walls (the first side wall 25, the second side wall 26) belonging to the wall 20 of the container body 2, the agent holding member 8 allows the dehumidifying agent 9 to be placed into the agent holding member 8 from the side adjacent to the container body opening 21 and allows the dehumidifying agent 9 to be removed from the agent holding member 8 toward the side adjacent to the container body opening 21. Due to this configuration, the substrate storing container 1 according to the present embodiment makes it easy to place and remove the dehumidifying agent 9 into and from a predetermined position after the support-forming members 4 and the agent holding members 8 have been disposed at respective predetermined positions in the substrate storing space 27 of the container body 2.

According to the present embodiment, each support-forming member 4 has communication holes 42 that establish communication between the substrates W supported on the lateral-side substrate supports 5 or the back-side substrate supports 6 and the agent holding members 8. Each agent holding member 8 is disposed opposite to the substrates W in the lateral direction D3 with the support-forming member 4 (the vertical plate-shaped body 40) interposed therebetween. However, due to the communication holes 42 formed in the support-forming member 4 (the vertical plate-shaped body 40), the dehumidifying function (moisture-absorbing function, drying function) of the dehumidifying agent 9, which is held and housed in each agent holding member 8 that is disposed opposite in the lateral direction D3 to the substrates W with the support-forming member 4 (the vertical plate-shaped body 40) interposed therebetween, is likely to be performed in the atmosphere around the substrates W.

[Modifications]

The present invention is not limited to the embodiments described above, and can be modified within the technical scope defined by the claims.

For example, the support-forming member 4 of the embodiment described above has the lateral-side substrate supports 5 and the back-side substrate supports 6 provided thereon, but the present invention is not limited thereto. The back-side substrate supports 6 may be formed integrally with the container body 2, and not on the support-forming member 4.

In the case of the disk-shaped substrates, the inner surfaces of the side walls (the first sidewall 25, the second sidewall 26) belonging to the wall 20 of the container body 2 only have to be formed so that the dehumidifying agent 9 can be disposed between the support-forming members 4 and the inner surfaces of the side walls (the first sidewall 25, the second sidewall 26).

The configuration of the support-forming member 4, such as the shape, the configuration, the number, and the presence or absence of each of the vertical plate-shaped body 40, the transverse plate parts 41, the communication holes 42, the front wall 43, the holding holes 44, the guide pieces 45, the front engagement parts 46, and the back engagement parts 47 are not limited to the examples described in the embodiment described above. The configuration of the agent holding member 8, such as the shape, the configuration, the number, and the presence or absence of the agent housing body 81, the agent insertion opening 82, the agent lid 83, the communication holes 84, and the spring piece 85 are not limited to the examples described in the embodiment described above.

Furthermore, the shape of the container body 2, the shape of the lid 3, and the number and dimensions of the substrates W that can be stored in the container body 2, which have been described in the above embodiment are all non-limiting examples.

EXPLANATION OF REFERENCE NUMERALS

1: Substrate storing container
2: Container body
20: Wall
21: Container body opening
25: First side wall (Side wall)
26: Second side wall (Side wall)
27: Substrate storing space
3: Lid
4: Support-forming member
40: Vertical plate-shaped body
41: Transverse plate part
42: Communication hole
43: Front wall
44: Holding hole
45: Guide piece
5: Lateral-side substrate support
6: Back-side substrate support
8: Agent holding member
81: Agent housing body
82: Agent insertion opening
83: Agent lid
84: Communication hole
84A: Inner communication hole
84B: Outer communication hole
84C: Lid-side communication hole
85: Spring piece
9: Dehumidifying agent
D3: Lateral direction, Left/right direction
W: substrate

The invention claimed is:

1. A substrate storing container, comprising:
a container body having a container body opening at one end, and a wall with a closed tubular shape at another end, the container body comprising a substrate storing space defined by an inner surface of the wall, wherein the substrate storing space is capable of storing a plurality of substrates and communicates with the container body opening;
a lid detachably attachable to the container body opening, and capable of closing the container body opening;
back-side substrate supports arranged in the substrate storing space, the back-side substrate supports being capable of supporting edge portions of the plurality of substrates and configured to support the plurality of substrates such that the edge portions of the plurality of substrates are arranged in parallel in a state where the container body opening is closed by the lid;
lateral-side substrate supports arranged to form counterparts to each other in a lateral direction in the substrate storing space, the lateral-side substrate supports being capable of supporting edge portions of the plurality of substrates when in contact with the edge portions of the plurality of substrates such that the substrates adjacent to each other are arranged in parallel at predetermined intervals; and
a support-forming member configured to be disposed to face an inner surface of a side wall belonging to the wall of the container body, wherein
the lateral-side substrate supports are provided on the support-forming member, and
a dehumidifying agent is removably disposed between the support-forming member and the inner surface of the side wall belonging to the wall of the container body and is accessible from the container body opening.

2. The substrate storing container according to claim 1, further comprising:
an agent holding member between the support-forming member and the inner surface of the side wall belonging to the wall of the container body, the agent holding member being configured to hold the dehumidifying agent.

3. The substrate storing container according to claim 2, wherein in a state where the support-forming member is disposed to face the inner surface of the side wall belonging to the wall of the container body, the agent holding member is insertable between the support-forming member and the inner surface of the side wall belonging to the wall of the container body from a side adjacent to the container body opening, and is removable toward the side adjacent to the container body opening.

4. The substrate storing container according to claim 2, wherein in a state where the agent holding member is disposed between the support-forming member and the inner surface of the side wall belonging to the wall of the container body, the agent holding member allows the dehumidifying agent to be placed into the agent holding member from a side adjacent to the container body opening and allows the dehumidifying agent to be removed from the agent holding member toward the side adjacent to the container body opening.

5. The substrate storing container according to claim 2, wherein the support-forming member has a communication hole that establishes communication between the substrates supported on the lateral-side substrate supports or the back-side substrate supports and the agent holding member.

* * * * *